US009572252B2

(12) United States Patent
Tsuchida et al.

(10) Patent No.: US 9,572,252 B2
(45) Date of Patent: Feb. 14, 2017

(54) WIRING SUBSTRATE AND METHOD OF MANUFACTURING WIRING SUBSTRATE (71) Applicants: TOPPAN PRINTING CO., LTD., Tokyo (JP); NATIONAL UNIVERSITY CORPORATION GUNMA UNIVERSITY, Maebashi (JP)

(72) Inventors: Tetsuyuki Tsuchida, Tokyo (JP); Toshikazu Okubo, Tokyo (JP); Ikuo Shohji, Maebashi (JP); Takahiro Kano, Matsumoto (JP)

(73) Assignees: TOPPAN PRINTING CO., LTD., Tokyo (JP); NATIONAL UNIVERSITY CORPORATION GUNMA UNIVERSITY, Maebashi (JP)

( * ) Notice: Subject to any disclaimer, the term of this patent is extended or adjusted under 35 U.S.C. 154(b) by 361 days.

(21) Appl. No.: 14/444,135

(22) Filed: Jul. 28, 2014

(65) Prior Publication Data
US 2014/0332259 A1 Nov. 13, 2014

Related U.S. Application Data (63) Continuation of application No. PCT/JP2013/052059, filed on Jan. 30, 2013.

(30) Foreign Application Priority Data

Jan. 30, 2012 (JP) ................................. 2012-017261

(51) Int. Cl.
B05D 5/12 (2006.01)
B28B 19/00 (2006.01)
(Continued)

(52) U.S. Cl.
CPC ............. H05K 1/09 (2013.01); C23C 18/1651 (2013.01); C23C 18/36 (2013.01); C23C 18/44 (2013.01);
(Continued)

(58) Field of Classification Search
CPC ..... B23K 35/007; B23K 35/262; C23C 18/31; C23C 18/34; C23C 18/36; C23C 18/44; C23C 18/50; C23C 18/1651; H01L 23/49816; H01L 24/48; H01L 24/49; H01L 31/022425; H01L 2224/131; H01L 2224/136; H01L 2224/1357; H01L 2224/13147; H01L 2224/13155; H01L 2224/13157; H01L 2224/45144; H01L 2224/48091; H01L 2224/48227; H01L 2224/49109; H01L 2924/00; H01L 2924/0002; H01L 2924/181; H01L 2924/0102; H01L 2924/1517; H01L 2924/1532; H01L 2924/00013; H01L 2924/00014; H01L 2924/01039; H01L 2924/01046; H01L 2924/01078; H01L 2924/01079; H01L 2924/12042; H01L 2924/15153; H05K 1/09; H05K 1/118; H05K 1/162; H05K 3/243; H05K 3/244; H05K 3/3436; H05K 3/3463; H05K 3/4602; H05K 2201/032; H05K 2201/0215; H05K 2201/0347; H05K 2201/0776; H05K 2201/0959; H05K 2201/09509; H05K 2201/10234; H05K 2201/10242; H05K 2201/10992; H05K 2203/041; H05K 2203/072; H05K 2203/0415; Y02P 70/613; Y02E 10/50; Y10T 428/12028; Y10T 428/12701; Y10T 428/12708; Y10T 428/12875; Y10T 428/12903; Y10T 428/12944
(Continued)

(56) References Cited

U.S. PATENT DOCUMENTS 6,358,630 B1 * 3/2002 Tsukada ............... B23K 35/007
219/129
(Continued)

FOREIGN PATENT DOCUMENTS

CN 1287035 3/2001
(Continued)

OTHER PUBLICATIONS

Chinese Office Action dated Jan. 26, 2016 in corresponding Chinese Patent Application No. 201380004706.9.
(Continued)

Primary Examiner — Timothy Thompson
Assistant Examiner — Guillermo Egoavil (57) ABSTRACT A wiring substrate includes an electrode including Cu or a Cu alloy, and a plated film including an electroless nickel-
(Continued)

plated layer formed on the electrode and an electroless gold-plated layer formed on the electroless nickel-plated layer. The electroless nickel-plated layer is formed by co-precipitation of Ni, P, Bi, and S, the electroless nickel-plated layer includes a content of P of 5% by mass or more and less than 10% by mass, a content of Bi of 1 ppm by mass to 1,000 ppm by mass, and a content of S of 1 ppm by mass to 2,000 ppm by mass, and a mass ratio of the content of S to the content of Bi (S/Bi) is more than 1.0.

6 Claims, 4 Drawing Sheets

(51) Int. Cl.
    | | | |
    |---|---|---|
    | *C23C 18/00* | (2006.01) | |
    | *H01C 17/06* | (2006.01) | |
    | *H05K 3/00* | (2006.01) | |
    | *H05K 1/09* | (2006.01) | |
    | *C23C 18/36* | (2006.01) | |
    | *C23C 18/44* | (2006.01) | |
    | *C23C 18/16* | (2006.01) | |
    | *H05K 3/24* | (2006.01) | |
    | *C23C 18/50* | (2006.01) | |

(52) U.S. Cl.
    CPC ............ *C23C 18/50* (2013.01); *H05K 3/243* (2013.01); *H05K 3/244* (2013.01); *H05K 2201/032* (2013.01); *H05K 2201/0776* (2013.01); *H05K 2203/072* (2013.01)

(58) Field of Classification Search
    USPC ............ 75/255; 106/1.22, 1.13, 1.12, 1.24; 174/126.1, 257, 254; 219/85.1, 129; 257/79, E23.069, 691; 427/99.5, 304, 427/443.1, 548, 645, 646, 670, 674, 680; 428/42; 524/435
    See application file for complete search history.

(56) References Cited

U.S. PATENT DOCUMENTS

| | | |
|---|---|---|
| 7,704,307 B2 | 4/2010 | Aiba et al. |
| 2004/0058468 A1* | 3/2004 | Takahashi ......... H01L 31/02242 438/42 |
| 2007/0108588 A1* | 5/2007 | Shimada ................ H05K 1/162 257/691 |
| 2008/0277140 A1 | 11/2008 | Kurosaka et al. |
| 2010/0155108 A1* | 6/2010 | Lee ........................ C23C 18/34 174/254 |

FOREIGN PATENT DOCUMENTS

| | | | |
|---|---|---|---|
| CN | 101760731 | | 6/2010 |
| JP | 2000-124571 | | 4/2000 |
| JP | 2000124571 A | * | 4/2000 |
| WO | WO 2007/010760 A1 | | 1/2005 |

OTHER PUBLICATIONS

Chinese Office Action dated Jun. 11, 2015 in corresponding Chinese Patent Application No. 201380004706.9.
International Search Report mailed Mar. 12, 2013, in corresponding International Patent Application No. PCT/JP2013/052059.
Extended European Search Report dated Sep. 4, 2015 in corresponding European Patent Application No. 13744378.4.

* cited by examiner

WIRING SUBSTRATE AND METHOD OF MANUFACTURING WIRING SUBSTRATE

CROSS REFERENCE TO RELATED APPLICATIONS

This application is a continuation application based on a PCT Patent Application No. PCT/JP2013/052059, filed Jan. 30, 2013, whose priority is claimed on Japanese Patent Application No. 2012-017261 filed Jan. 30, 2012, the entire contents of which are hereby incorporated by reference.

BACKGROUND OF THE INVENTION

Field of the Invention

The present invention relates to a wiring substrate and a method of manufacturing a wiring substrate.

Description of the Related Art

As for a wiring substrate such as a semiconductor chip-mounting substrate including an electrode composed of Cu or a Cu alloy or a printed wiring substrate, a multilayer wiring substrate formed by a build-up method has been widely adopted to improve the function of the wiring substrate by raising the frequency of the wiring substrate and increasing the wiring density of the wiring substrate. Electronics manufacturers have competed for mounting electronic components on a wiring substrate at a high density to reduce the size, thickness and weight of a product, and a multi-pin technology and a narrow pitch technology for packaging have rapidly progressed. Specifically, technologies for mounting electronic components on a printed wiring substrate have been developed from Quad Flat Package (QFP) in the related art to Ball Grid Array (BGA) and Chip Size Package (CSP) mounting as area surface mounting.

Among the above, a flip chip-ball grid array (FC-BGA) technology in which a semiconductor chip is mounted on a printed wiring substrate with an interposer interposed therebetween and copper electrodes provided on the printed wiring substrate and the interposer are electrically connected to each other by a solder ball has attracted attention since the FC-BGA technology is available at a lower cost compared to mounting technologies by wire bonding using a gold wire.

In order to reliably connect the copper electrodes provided on the printed wiring substrate and the interposer, the interposer and the copper electrodes are subjected to surface treatment. As an example of the surface treatment, a nickel/gold plating treatment in which a surface of an electrode is subjected to nickel plating treatment and then gold plating treatment is known. In recent years, a nickel/palladium/gold treatment in which nickel plating treatment, palladium plating treatment and gold plating treatment are sequentially performed has been widely used due to high reliability of mounting technologies using a solder ball. Particularly, compared to surface treatment using an electroplating method in the plating treatment, surface treatment using an electroless plating method in the plating treatment is advantageous in that routing of wiring is not required on a wiring substrate in which wiring is arranged at a high density, and thus, the surface treatment using an electroless plating method has attracted attention.

Generally, in an electroless nickel plating bath, Pb, which acts as a trace additive and has an effect of stabilizing the plating bath, and a sulfur-based compound, which acts as a trace additive, has an effect of stabilizing the plating bath, and also, acts as an accelerator are included. These two kinds of trace additives co-precipitate Pb, S and the like in an electroless nickel-plated film formed by plating treatment, and influence the reliability of mounting technologies by solder and various properties such as selective precipitation capability or the like in the plating treatment.

The amount of Pb included in the electroless nickel-plated film by the plating treatment is several hundred ppm. As an environmental regulation regarding Pb, Restriction of Hazardous Substances (RoHS) directive has been established. However, the upper limit of Pb in the RoHS directive is 1,000 ppm, and the electroless nickel-plated film is not included as a target to be regulated. On the other hand, an environmental regulation, Joint Industry Guideline (JIG), which prevents intentional addition of Pb to a plating bath has also been established, and the environmental regulation regarding Pb is expected to become stricter in the future.

On the other hand, a solder-mounting material has gradually changed from a conventional Sn—Pb-based solder that is regulated by the RoHS directive to a solder that does not contain Pb. Specifically, a Sn—Ag—Cu-based solder such as Sn-3Ag-0.5Cu can be used.

As described above, the plated film and the solder are changed to a plated film and a solder that do not contain Pb, respectively. Therefore, it is important to ensure mounting reliability in a wiring substrate. To obtain high mounting reliability in a wiring substrate, excellent reflow resistance to endure plural times of reflow using multilayer wiring in Flip-Chip mounting or the like and excellent aging resistance to endure continuous use at a high operation temperature are required for a wiring substrate.

As a wiring substrate having high mounting reliability, a wiring substrate is proposed, including a plated film formed of a laminated film in which an electroless nickel-phosphorus plating layer containing Bi and an electroless gold-plated layer are laminated on a copper electrode (for example, see Japanese Unexamined Patent Application, First Publication No. 2000-124571).

However, since a precipitation rate of Ni is low in the electroless nickel-phosphorus plating layer, the content of P is increased. Therefore, it is difficult to obtain sufficient mounting reliability.

SUMMARY OF THE INVENTION

An object of the present invention is to provide a wiring substrate having excellent reflow resistance and aging resistance, and high mounting reliability, and a method of manufacturing a wiring substrate.

According to a first aspect of the present invention, a wiring substrate is provided, including an electrode including Cu or a Cu alloy, and a plated film including an electroless nickel-plated layer formed on the electrode and an electroless gold-plated layer formed on the electroless nickel-plated layer, in which the electroless nickel-plated layer is formed by co-precipitation of Ni, P, Bi, and S, the electroless nickel-plated layer includes a content of P of 5% by mass or more and less than 10% by mass, a content of Bi of 1 ppm by mass to 1,000 ppm by mass, and a content of S of 1 ppm by mass to 2,000 ppm by mass, and a mass ratio of the content of S to the content of Bi (S/Bi) is more than 1.0.

A total of the content of Bi and the content of S in the electroless nickel-plated layer may be 400 ppm by mass or more.

An electroless palladium-plated layer may be formed between the electroless nickel-plated layer and the electroless gold-plated layer.

A thickness of the electroless nickel-plated layer may be 0.5 μm or more, a thickness of the electroless palladium-plated layer may be 0.05 µm to 0.2 µm, and a thickness of the electroless gold-plated layer may be 0.01 µm to 0.5 µm.

The wiring substrate may further include a solder which contains Cu and does not contain Pb, and is bonded onto the plated film by heating, and an intermetallic compound layer formed at a bonding interface between the plated film and the solder, and an element ratio of Ni included in the intermetallic compound layer may be 30% by atom or less.

According to a second aspect of the present invention, a method of manufacturing a wiring substrate is provided, which is a method of manufacturing the wiring substrate according to the first aspect of the present invention, including forming the electroless nickel-plated layer on the electrode by electroless nickel plating treatment using an electroless nickel plating bath including nickel salt, a reducing agent containing P, bismuth salt, and a sulfur-based compound.

The wiring substrate according to the aspect of the present invention has excellent reflow resistance and aging resistance, and has high mounting reliability.

In addition, according to the method of manufacturing a wiring substrate according to the aspect of the present invention, it is possible to obtain a wiring substrate which has excellent reflow resistance and aging resistance, and has high mounting reliability.

DETAILED DESCRIPTION OF THE PREFERRED EMBODIMENTS

<Wiring Substrate>

A wiring substrate according to an embodiment of the present invention includes an electrode composed of Cu or a Cu alloy, and a plated film formed on the electrode. The plated film is a laminated film including an electroless nickel-plated layer that is formed on the electrode, and an electroless gold-plated layer that is formed on the electroless nickel-plated layer. In the present invention, the expression "the electroless gold-plated layer is formed on the electroless nickel-plated layer" includes a form in which the electroless gold-plated layer is formed directly on the electroless nickel-plated layer, and a form in which the electroless gold-plated layer is indirectly formed above the electroless nickel-plated layer such that another layer such as an electroless palladium-plated layer is formed on the electroless nickel-plated layer and then, the electroless gold-plated layer is formed on the another layer.

Figure 1:
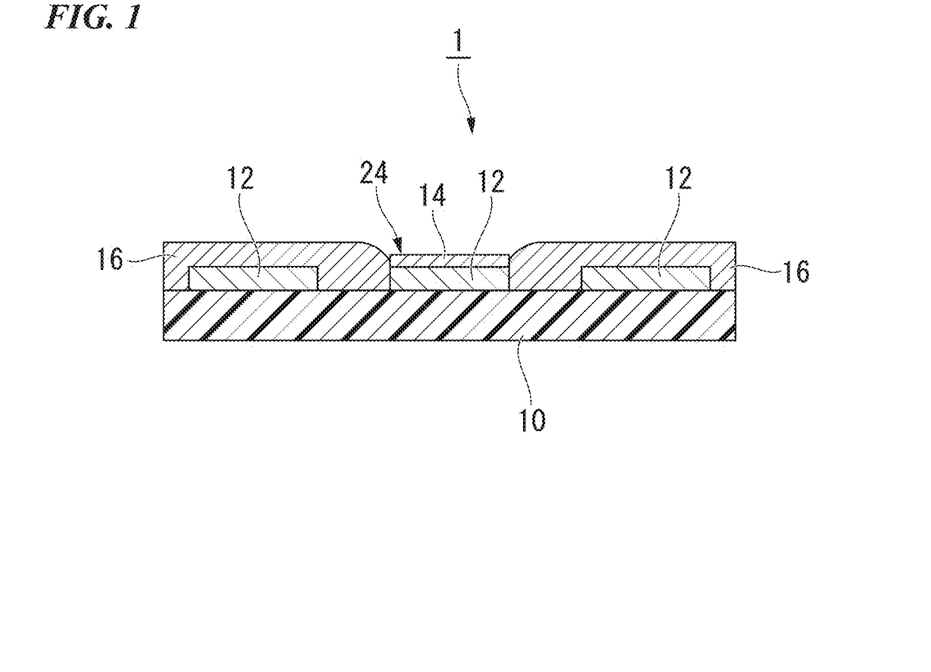
FIG. 1 is a cross-sectional view showing an example of a wiring substrate according to an embodiment of the present invention.

Hereinafter, an example of the wiring substrate according to the embodiment of the present invention is described in detail. FIG. 1 is a cross-sectional view showing a wiring substrate 1 as an example of the wiring substrate according to the embodiment.

As shown in FIG. 1, the wiring substrate 1 includes an insulating resin substrate 10, an electrode 12 formed on the insulating resin substrate 10, a plated film 14 formed on the electrode 12, and a solder resist layer 16 which protects the electrode 12.

Figure 2:
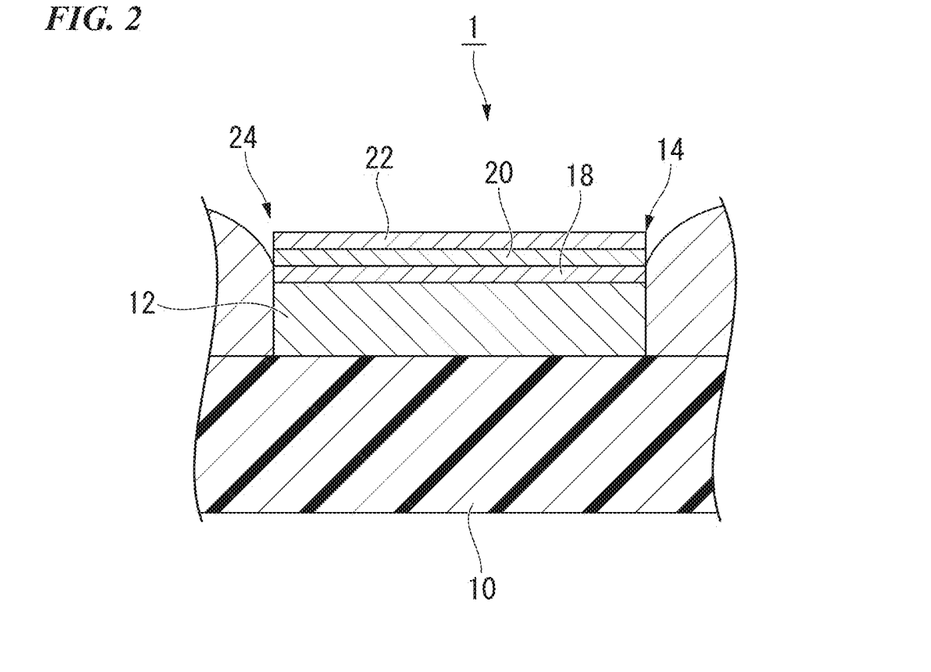
FIG. 2 is an enlarged cross-sectional view showing a plated film portion of FIG. 1.

The plated film 14 is formed on the surface of a pad 24 that is a solder bonding portion in the electrode 12. As shown in FIG. 2, the plated film 14 is a laminated film in which an electroless nickel-plated layer 18, an electroless palladium-plated layer 20, and an electroless gold-plated layer 22 are sequentially laminated from a position close to the electrode 12.

Examples of the insulating resin for forming the insulating resin substrate 10 include glass epoxy resin, paper epoxy resin, paper phenol resin, polyimide films, and polyester films.

The electrode 12 is an electrode composed of Cu or a Cu alloy and forms a predetermined electric circuit. Examples of the Cu alloy include alloys composed of Zn, Ni, Sn, Fe, Cr, Mg, Si, P or the like, and Cu.

The electrode 12 can be formed by a known method such as a subtractive method, a semi-additive method, or an additive method.

In addition, the electrode 12 is covered by the solder resist layer 16 to be protected. The pad 24 as a solder bonding portion is not covered by the solder resist layer 16. The solder resist layer 16 can be formed by applying a solder resist by a known method such as a screen printing method, or a photolithography method.

The electroless nickel-plated layer 18 is formed by co-precipitation of Ni, P, Bi, and S by electroless nickel plating treatment.

In the electroless nickel-plated layer 18 of the present invention, the content of P is 5% by mass or more and less than 10% by mass, the content of Bi is 1 ppm by mass to 1,000 ppm by mass, and the content of S is 1 ppm by mass to 2,000 ppm by mass. In addition, a mass ratio of the content of S to the content of Bi (S/Bi) is more than 1.0. Thus, excellent reflow resistance and aging resistance can be obtained in the wiring substrate. As a result, it is possible to obtain high mounting reliability in the wiring substrate. The factors for obtaining such effects are considered as follows.

Figure 3:
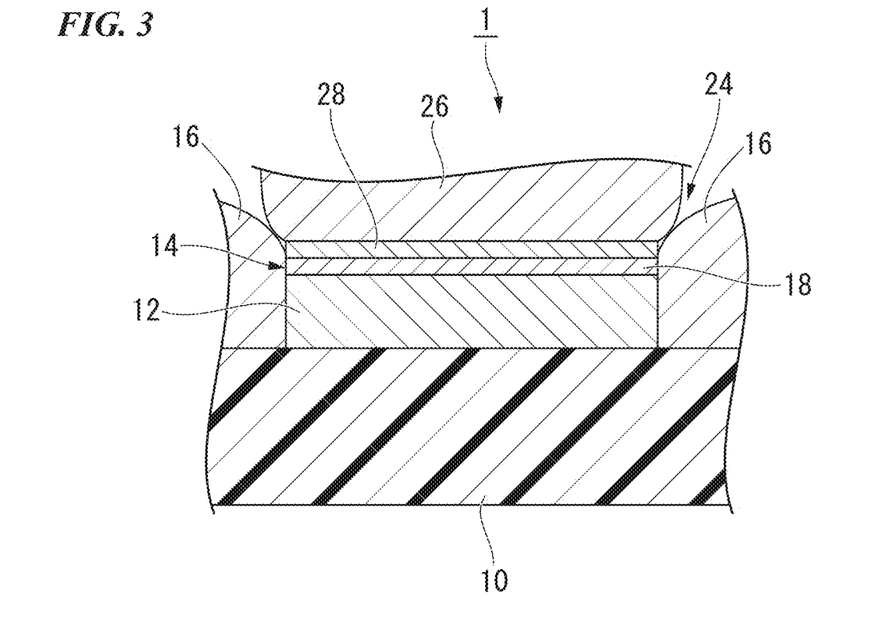
FIG. 3 is a cross-sectional view showing a state in which solder-mounting is performed on the wiring substrate of FIG. 2.

As shown in FIG. 3, an intermetallic compound layer 28 composed of an intermetallic compound such as (Cu, Ni)6Sn5 or the like is formed at the bonding interface between the plated film 14 and the solder 26 by Ni included in the electroless nickel-plated layer 18, and Cu and Sn included in a solder 26 during solder bonding by heating at solder-mounting. Pd included in the electroless palladium-plated layer 20 and Au included in the electroless gold-plated layer 22 dissolve in the solder 26. At this time, a large amount of Ni included in the electroless nickel-plated layer 18 dissolves in the solder 26. Therefore, P included in the electroless nickel-plated layer 18 is concentrated at the position close to the bonding interface between the plated film 14 and the solder 26 to form a phosphorus-rich layer having a low strength. Therefore, mounting reliability is decreased in the wiring substrate.

In the present invention, the contents of P, Bi, and S included in the electroless nickel-plated layer 18, and the ratio of Bi and S are within specific ranges. Thus, the intermetallic compound layer composed of Cu, Ni, and Sn having a high density is uniformly formed without excessive dissolution of Ni in the solder at the time of solder-mounting. Therefore, even when reflow is performed plural times, diffusion of Ni is suppressed. As a result, the formation of the phosphorus-rich layer is suppressed at the position close to the bonding interface between the plated film 14 and the solder 26, and high mounting reliability can be obtained in the wiring substrate. In addition, Bi dissolves in the solder 26 at the time of solder-mounting to form a solidification nucleus. Therefore, an Ag—Sn alloy (Ag3Sn) included in a solder bulk is finely dispersed in the solder bulk, and coarsening of the Ag—Sn alloy (Ag3Sn) is suppressed. As a result, it is possible to obtain a wiring substrate having excellent mounting reliability even when the substrate is continuously used at a high operation temperature.

The content of P included in the electroless nickel-plated layer 18 is 5% by mass or more and less than 10% by mass, preferably 5.3% by mass to 8.5% by mass, and more preferably 5.7% by mass to 8.0% by mass.

When the content of P is equal to or more than the lower limit, at the time of the formation of the electroless palladium-plated layer 20 and the electroless gold-plated layer 22, the electroless nickel-plated layer 18 is more resistant to corrosion. Further, when the content of P is equal to or less than the upper limit, a phosphorus-rich layer is not easily formed at the bonding interface between the plated film 14 and the solder 26 at the time of solder-mounting, and the mounting reliability of the wiring substrate is improved.

The content of Bi included in the electroless nickel-plated layer 18 is 1 ppm by mass to 1,000 ppm by mass, preferably 100 ppm by mass to 500 ppm by mass, and more preferably 120 ppm by mass to 400 ppm by mass.

When the content of Bi is equal to or more than the lower limit, a void is not easily formed at the boding interface between the plated film 14 and the solder 26, and the mounting reliability of the wiring substrate is improved. When the content of Bi is equal to or less than the upper limit, Bi dissolved in the solder is not easily coarsely crystallized in the solder bulk at the time of solder-mounting, and thus, the impact resistance of the wiring substrate is improved.

The content of S included in the electroless nickel-plated layer 18 is 1 ppm by mass to 2,000 ppm by mass, preferably 250 ppm by mass to 1,500 ppm by mass, and more preferably 300 ppm by mass to 1,100 ppm by mass.

When the content of S is equal to or more than the lower limit, the content of P included in the electroless nickel-plated layer 18 is further decreased. Therefore, a phosphorus-rich layer is not easily formed at the bonding interface between the plated film 14 and the solder 26 in the mounting by the solder not containing Pb, and the mounting reliability of the wiring substrate is improved. When the content of S is equal to or less than upper limit, at the time of solder-mounting, the amount of Ni dissolved in the solder is further decreased. Therefore, the intermetallic compound layer 28 becomes thinner and a void is not as easily formed at the bonding interface between the plated film 14 and the solder 26. Thus, the mounting reliability of the wiring substrate is improved.

The content of Ni included in the electroless nickel-plated layer 18 is preferably 89.7% by mass to 95.0% by mass, more preferably 91.3% by mass to 94.7% by mass, and still more preferably 91.9% by mass to 94.3% by mass.

In order to improve the mounting reliability of the wiring substrate, a mass ratio of the content of S to the content of Bi (S/Bi) included in the electroless nickel-plated layer 18 is preferably 2.0 or more. In addition, an excessive increase in the ratio of S to Bi causes a decrease in solder wettability, and thus, the mass ratio (S/Bi) is preferably 2,000 or less, more preferably 10.0 or less, and still more preferably 3.0 or less.

In addition, a total of the content of Bi and the content of S included in the electroless nickel-plated layer 18 is preferably 400 ppm by mass or more. In this case, the intermetallic compound layer 28 composed of Cu, Ni, and Sn and having a high density is easily formed uniformly at the time of solder-mounting. Therefore, further excellent reflow resistance and aging resistance can be obtained in the wiring substrate.

In order to improve the mounting reliability of the wiring substrate, a total of the content of Bi and the content of S is preferably 1,000 ppm by mass or more. In addition, as the density of bismuth salt and the density of a sulfur-based compound increase in the plating bath, the hardness of the plated film is easily prevented from increasing excessively. Therefore, the total of the content of Bi and the content of S is preferably 3,000 ppm by mass or less, and more preferably 1,500 ppm by mass or less.

The electroless nickel-plated layer 18 may contain different elements other than Ni, P, Bi, and S in so far as the elements do not deteriorate the effects of the present invention. That is, the electroless nickel-plated layer may be a layer formed by co-precipitation of Ni, P, Bi, and S and different elements other than Ni,P, Bi and S.

Examples of the other elements include C, H, and the like. C is co-precipitated as a complex or a buffer, and H is co-precipitated as a decomposition product of a reducing agent.

The thickness of the electroless nickel-plated layer 18 is preferably 0.5 μm or more, and more preferably 3 μm to 5 μm.

When the thickness of the electroless nickel-plated layer 18 is equal to or more than the lower limit, the plated film 14 having a uniform thickness is easily formed. Therefore, a Cu—Sn-based intermetallic compound such as Cu6Sn5, Cu3Sn, or the like is not easily mixed with the intermetallic compound layer 28 formed by solder-mounting. Thus, the intermetallic compound layer 28 that is composed of a Cu—Ni—Sn-based intermetallic compound such as (Cu, Ni)6Sn5 or the like and that has a uniform composition is easily formed and the mounting reliability of the wiring substrate is improved. In addition, the properties of the wiring substrate are rarely changed even when the thickness of the electroless nickel-plated layer 18 becomes thicker than 5 μm. Thus, a plating time can be shortened by forming the electroless nickel-plated layer 18 to have a thickness of 5 μm or less.

As a method of forming the electroless palladium-plated layer 20, for example, an electroless palladium-phosphorus plating method, and an electroless pure palladium plating method are known. However, the method is not limited to these two methods.

The thickness of the electroless palladium-plated layer 20 is preferably 0.05 μm to 0.2 μm, and more preferably 0.06 μm to 0.15 μm.

When the thickness of the electroless palladium-plated layer 20 is equal to or more than the lower limit, the time when Ni included in the electroless nickel-plated layer 18 dissolves in the solder is further shortened at the time of solder-mounting. As a result, a phosphorus-rich layer is not easily formed at the position close to the bonding interface between the plated film 14 and the solder 26. Therefore, the mounting reliability of the wiring substrate is improved. When the thickness of the electroless palladium-plated layer 20 is equal to or less than the upper limit, at the time of solder-mounting, Pd easily dissolves in the solder and rarely remains as a film on the bonding interface between the plated film 14 and the solder 26 after the solder-mounting. As a result, the mounting reliability of the wiring substrate is improved.

As a method of forming the electroless gold-plated layer 22, for example, a substitution gold plating method, a substitution-reduction gold plating method, and a reduction gold plating method are known. However, the method is not limited to these three methods.

In order to secure sufficient solder wettability, the thickness of the electroless gold-plated layer 22 is preferably 0.01 µm to 0.5 µm, and more preferably 0.02 µm to 0.1 µm. When the thickness of the electroless gold-plated layer 22 is equal to or less than the upper limit, the segregation of the intermetallic compound is easily suppressed at the bonding interface between the plated film 14 and the solder 26, and the mounting reliability of the wiring substrate is improved.

In the wiring substrate of the embodiment, the solder 26 containing Cu and not containing Pb is bonded onto the plated film 14 by heating through solder-mounting. An element ratio of Ni included in the intermetallic compound layer 28 that is formed at the bonding interface between the plated film 14 and the solder 26 is preferably 30% by atom or less.

As a result, since excellent reflow resistance and aging resistance can be obtained in the wiring substrate, the mounting reliability of the wiring substrate is further improved.

In order to obtain excellent reflow resistance and aging resistance in the wiring substrate, the element ratio of Ni is more preferably 20% by atom or less, and still more preferably 15% by atom or less. In addition, the intermetallic compound layer 28 having a uniform structure composed of a Cu—Ni—Sn-based intermetallic compound such as (Cu, Ni)6Sn5 or the like can be easily formed and thus, the element ratio of Ni is preferably 5% by atom or more, and more preferably 10% by atom or more.

Examples of the solder containing Cu and not containing Pb include solders containing Sn and Cu, and containing at least one or more element of Ag, Bi, In, Ge, Ni, and P. Specific examples thereof include Sn-3Ag-0.5Cu, Sn-3.5Ag-0.75Cu, Sn-40Bi-0.1Cu, Sn-2Ag-0.5Cu-2Bi, Sn-1Ag-0.1Cu—In—Ni, Sn-3.5Ag-0.5Cu—Ni—Ge, Sn-0.7Cu-0.03Ni—P, and the like.

<Method of Manufacturing Wiring Substrate>

Hereinafter, as an example of a method of manufacturing a wiring substrate according to an embodiment, a method of manufacturing the wiring substrate 1 will be described. As the method of manufacturing the wiring substrate 1, for example, a method is known including an electroless nickel plating process, an electroless palladium plating process, and an electroless gold plating described as follows:

an electroless nickel plating process of forming the electroless nickel-plated layer 18 on the electrode 12 by electroless nickel plating treatment using an electroless nickel plating bath including nickel salt, a reducing agent containing P, bismuth salt, and a sulfur-based compound;

an electroless palladium plating process of forming the electroless palladium-plated layer 20 on the electroless nickel-plated layer 18 by electroless palladium plating treatment; and an electroless gold plating process of forming the electroless gold-plated layer 22 on the electroless palladium-plated layer 20 by electroless gold plating treatment.

(Electroless Nickel Plating Process)

A wiring substrate precursor including the insulating resin substrate 10, the electrode 12 formed on the insulating resin substrate 10, and the solder resist layer 16 covering the electrode 12 and not covering the pad 24 is immersed in an electroless nickel plating bath in which nickel salt, a reducing agent containing P, bismuth salt, and a sulfur-based compound are dissolved in water. In this manner, Ni, P, Bi, and S are co-precipitated on the electrode 12 by the action of the reducing agent and thus, the electroless nickel-plated layer 18 is formed on the electrode 12.

Examples of the nickel salt include nickel sulfate, nickel chloride, nickel sulfamate, and nickel hypophosphite. Among these, the nickel density of nickel sulfate is simply measured by titration. In addition, among these nickel salts, the nickel density of nickel sulfate is most simply managed. Therefore, nickel sulfate is preferable.

These nickel salts may be used singly or in combination of two or more types of nickel salts.

The reducing agent containing P is more advantageous in terms of cost and workability compared to a reducing agent such as dimethylamineborane, hydrazine, or the like. In addition, P co-precipitated by the decomposition of the reducing agent containing P is co-precipitated in the electroless nickel-plated film, and corrosion resistance can be obtained in the electroless nickel-plated film. Therefore, the electroless nickel-plated film is prevented from being excessively oxidized at the time of substitution gold plating treatment. Examples of the reducing agent containing P include sodium phosphate, and sodium hypophosphite. Among these, sodium hypophosphite having a strong reduction action against nickel ions is preferable. These reducing agents containing P may be used singly or in combination of two or more types of reducing agents containing P.

Examples of the bismuth salt include bismuth nitrate, bismuth oxide, and bismuth chloride. These bismuth salts may be used singly or in combination of two or more types of bismuth salts.

Examples of the sulfur-based compound include thiourea, thiosulfate, disulfide, thiol, and derivatives thereof. These sulfur-based compounds may be used singly or in combination of two or more of sulfur-based compounds.

The electroless nickel plating bath may contain components such as a complexing agent and a buffer, other than nickel salt, the reducing agent, bismuth salt, and the sulfur-based compound. Examples of the complexing agent include acetic acid, lactic acid, oxalic acid, malonic acid, and malic acid. In addition, examples of the buffer include formic acid, acetic acid, oxalic acid, succinic acid, malonic acid, lactic acid, and citric acid.

The content of the nickel salt included in the electroless nickel plating bath is preferably 5 g/L to 6 g/L. When the content of the nickel salt is equal to or more than the lower limit, an appropriate plating rate is easily achieved. When the content of the nickel salt is equal to or less than the upper limit, an excessive increase in the plating rate is easily suppressed.

The content of the reducing agent containing P included in the electroless nickel plating bath is preferably 20 g/L to 30 g/L. When the content of the reducing agent is equal to or more than the lower limit, the electroless nickel-plated layer 18 resistant to corrosion is easily formed in the electroless palladium plating process and the electroless gold plating process. When the content of the reducing agent is equal to or less than the upper limit, the plated film 14 in which a phosphorus-rich layer is not easily formed at the position close to the bonding interface between the plated film and the solder at the time of solder-mounting is easily formed.

As described above, the content of the bismuth salt, the content of the sulfur-based compound, the ratio of the bismuth salt and the sulfur-based compound included in the electroless nickel plating bath is determined such that the content of P is 5% by mass or more and less than 10% by mass, the content of Bi is 1 ppm by mass to 1,000 ppm by mass, the content of S is 1 ppm by mass to 2,000 ppm by mass, the mass ratio of the content of S to the content of Bi (S/Bi) has a value larger than 1.0, and the total of the content of Bi and the content of S is 400 ppm by mass or more in the electroless nickel-plated layer formed by co-precipitation of Ni, P, Bi, and S. The plating reaction rate is changed by adjusting the density of the bismuth salt and the sulfur-based compound. Thus, the content of the bismuth salt, the content of the sulfur-based compound, and the ratio of the bismuth salt and the sulfur-based compound included in the electroless nickel-plated layer can be adjusted. The density of the bismuth salt and the density of the sulfur-based compound may be appropriately adjusted by adjusting the density of other components included in the electroless nickel plating bath, the density of impurities, temperature, stirring rate, and the like.

In the electroless nickel plating, the temperature of the electroless nickel plating bath is preferably 75° C. to 95° C.

(Electroless Palladium Plating Process)

The wiring substrate precursor including the insulating resin substrate 10, the electrode 12 formed on the insulating resin substrate 10, and the electroless nickel-plated layer 18 formed on the surface of the electrode 12 is immersed in the electroless palladium plating bath to form the electroless palladium-plated layer 20 on the electroless nickel-plated layer 18.

The electroless palladium plating is not particularly limited and electroless palladium-phosphorus plating, electroless pure palladium plating, and the like may be used.

(Electroless Gold Plating Process)

The wiring substrate precursor including the insulating resin substrate 10, the electrode 12 formed on the insulating resin substrate 10, the electroless nickel-plated layer 18 formed on the surface of the electrode 12, and the electroless palladium-plated layer 20 is immersed in the electroless gold plating bath to form the electroless gold-plated layer 22 on the electroless palladium-plated layer 20.

The electroless gold plating is not particularly limited and substitution gold plating, substitution-reduction gold plating, reduction gold plating, or the like may be used.

The wiring substrate according to the above-described embodiment includes a plated film formed of a laminated film having an electroless nickel-plated layer. The electroless nickel-plated layer is formed by co-precipitation of specific amounts of P, Bi, and S. The ratio of the content of Bi and the content of S in the electroless nickel-plated layer is a specific ratio. Therefore, since sufficient reflow resistance and excellent aging resistance can be obtained in the wiring substrate, high mounting reliability can be obtained in the wiring substrate.

The wiring substrate of the present invention is not limited to the wiring substrate 1 according to the above-described embodiment.

For example, the plated film of the wiring substrate of the present invention may not have an electroless palladium-plated layer. Specifically, the wiring substrate of the present invention may be a wiring substrate 2 shown in FIG. 4. In the wiring substrate 2 shown in FIG. 4, the same constitutional elements as those in the wiring substrate 1 shown in FIG. 2 are designated by the same reference numerals as those in FIG. 2, and thus, the description will be omitted.

Figure 4:
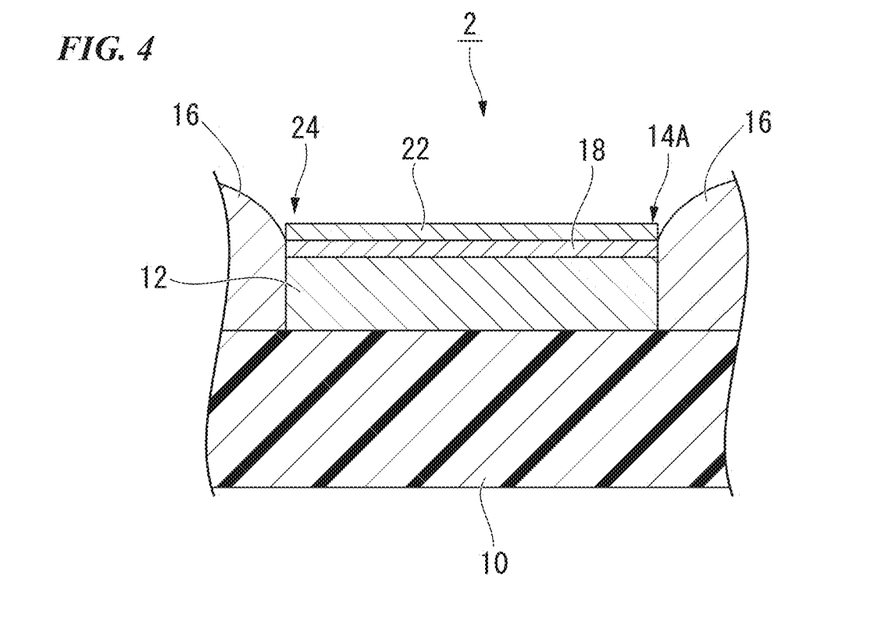
FIG. 4 is an enlarged cross-sectional view showing another example of the wiring substrate according to the embodiment of the present invention.

The wiring substrate 2 includes a plated film 14A formed of a laminated film in which the electroless nickel-plated layer 18 and the electroless gold-plated layer 22 are laminated from the position close to the electrode 12, instead of the plated film 14 in the wiring substrate 1. However, in the wiring substrate 1 and the wiring substrate 2, other constitutional elements except the plated film are the same. Even in the wiring substrate 2, the contents of P, Bi, and S and the ratio of the contents of Bi and S in the electroless nickel-plated layer 18 are within the above-described specific ranges. Therefore, excellent reflow resistance and aging resistance can be obtained in the wiring substrate.

Comparing the wiring substrate 1 and the wiring substrate 2, higher mounting reliability can be obtained in the wiring substrate 1 than in the wiring substrate 2. Thus, the wiring substrate 1 including the plated film 14 having the electroless palladium-plated layer 20 is preferable.

EXAMPLES

Hereinafter, the present invention will be described in detail with reference to examples, but the present invention is not limited by the following description.

Manufacturing Example 1

The insulating resin substrate composed of glass epoxy resin and having a thickness of 0 8 mm was subjected to electroless copper plating and electric copper plating, and a copper pattern was formed by a subtractive method. Next, constitutional elements other than the pad (pad diameter: a diameter of 300 µm) were covered by the solder resist (product name: "AUS308" manufactured by Taiyo Ink Mfg. Co., Ltd.) in the electrode to obtain a wiring substrate-1 having a copper electrode.

Example 1

Using an electroless nickel plating bath (bath temperature: 81° C.) in which nickel sulfate (20 g/L), sodium hypophosphite (20 g/L) as a reducing agent, lactic acid (30 g/L) as a complexing agent, bismuth nitrate as bismuth salt, and thiourea as a sulfur-based compound were dissolved in water, an electroless nickel-plated layer having a thickness of 3 µm was formed on the pad of the wiring substrate-1.

Next, using an electroless palladium plating bath (bath temperature: 43° C.) including tetraammine palladium (0.8 g/L as Pd), sodium hypophosphite (10 g/L), bismuth nitrate (2 mg/L), and phosphoric acid (10 g/L), an electroless palladium-plated layer having a thickness of 0.1 µm was formed on the electroless nickel-plated layer.

Next, using an electroless gold plating bath (bath temperature: 86° C.) including gold potassium cyanide (1.0 g/L as Au), thiosulfate (1 mg/L), citric acid (25 g/L), phosphoric acid (10 g/L), an electroless gold-plated layer having a thickness of 0.05 µm was formed on the electroless palladium-plated layer, and a plated film in which the electroless nickel-plated layer, the electroless palladium-plated layer, and the electroless gold-plated layer were laminated was formed on the pad.

Each content of P, Si, and Bi included in the formed electroless nickel-plated layer was respectively measured by an X-ray fluorescent analysis thickness meter (apparatus name: "SEA5100", manufactured by SII NanoTechnology Inc.), a combustion-coulometry method, and an Inductively Coupled Plasma (ICP)-Mass Spectroscopy (MS) analysis method. As a result, the content of P was 5.80% by mass, the content of S was 1,000 ppm by mass, and the content of Bi was 340 ppm by mass. In addition, the content of P included in the formed electroless palladium-plated layer was 4% by mass.

Example 2

The amount of each component included in the electroless nickel plating bath was adjusted and a plated film having a three-layer structure, which includes an electroless nickel-plated layer with a composition shown in Table 1, was formed on the pad of the wiring substrate-1 in the same manner as in Example 1.

Comparative Examples 1 to 4

The amount of each component included in the electroless nickel plating bath was adjusted and a plated film having a three-layer structure, which includes an electroless nickel-plated layer with a composition shown in Table 1, was formed on the pad of the wiring substrate-1 in the same manner as in Example 1.

In Comparative example 1, since the components included in the electroless nickel plating bath were self-decomposed in the plating process, a plated film was not able to be formed.

Reference Example 1

Lead nitrate was used instead of using bismuth salt, the amount of each component included in the electroless nickel plating bath was adjusted, and a plated film having a three-layer structure, which includes an electroless nickel-plated layer with a composition shown in Table 1, was formed.

[Evaluation Method]

Each sample prepared in the following reflow tests (1) and (2), and aging tests (1) and (2) was subjected to a high-speed shear test using an impact resistance high-speed bond tester 4000HS (manufactured by Dage Japan Co., Ltd.) and solder bonding strength was measured. In addition, a fractured state after the high-speed shear test was checked and a solder fracture rate (a ratio in which fracture occurs in the solder formed above the intermetallic compound layer) was obtained and mounting reliability was evaluated in the wiring substrate. As the solder fracture rate increases, the bonding strength between the solder and the plated film increases, and thus, the mounting reliability of the wiring substrate increases.

Reflow Test (1)

On the plated film formed on the pad of the wiring substrate-1, a solder ball composed of Sn-3Ag-0.5Cu and having a diameter of 350 μm was arranged and ten samples each prepared by one time of reflow at a peak temperature of 240° C. were prepared.

Reflow Test (2)

On the plated film formed on the pad of the wiring substrate-1, a solder ball composed of Sn-3Ag-0.5Cu and having a diameter of 350 μm was arranged and ten samples, each prepared by five times of reflow at a peak temperature of 240° C., were prepared.

Aging Test (1)

Ten samples each prepared by performing one time of reflow in the same manner as in the reflow test (1) and heating and retaining the sample at 120° C. for one week were prepared.

Aging Test (2)

Ten samples each prepared by performing one time of reflow in the same manner as in the reflow test (1) and heating and retaining the sample at 120° C. for three weeks were prepared.

Evaluation results of the compositions of the electroless nickel-plated layer and mounting reliability in the wiring substrates in Examples 1 and 2, Comparative Examples 1 to 4, and Reference Example 1 are shown in Table 1. Further, reflected electron images of bonding interfaces between the plated films and the solders of the samples in Example 1 and Comparative Examples 2 to 4 imaged by EPMA-1610 (manufactured by Shimadzu Corporation) are shown in FIGS. 5 to 8.

TABLE 1

| | | Examples | | Comparative Examples | | | | Reference Example |
|---|---|---|---|---|---|---|---|---|
| | | 1 | 2 | 1 | 2 | 3 | 4 | 1 |
| Electroless Ni plating layer | Content of P [% by mass] | 5.80 | 5.95 | — | 7.41 | 6.99 | 8.33 | 6.45 |
| | Content of S [ppm by mass] | 1000 | 268 | — | 201 | 96 | 132 | 142 |
| | Content of Bi [ppm by mass] | 340 | 132 | — | — | 140 | 170 | — |
| | Content of Pb [ppm by mass] | — | — | — | — | — | — | 270 |
| | Mass ratio (S/Bi) | 2.90 | 2.03 | — | — | 0.69 | 0.78 | — |
| | (S + Bi) total content [ppm by mass] | 1340 | 400 | — | 201 | 236 | 302 | — |
| Reflow test (1) | Bonding strength [N] | 10.5 | 11.5 | — | 10.3 | 10.7 | 11.7 | 11.2 |
| | Solder fracture rate [%] | 100 | 100 | — | 30 | 100 | 100 | 100 |
| Reflow test (2) | Bonding strength [N] | 10.2 | 9.6 | — | 8.6 | 10.0 | 9.8 | 9.0 |
| | Solder fracture rate [%] | 100 | 60 | — | 20 | 70 | 60 | 60 |
| Aging test (1) | Bonding strength [N] | 10.1 | 10.5 | — | 10.5 | 10.6 | 10.5 | 10.5 |
| | Solder fracture rate [%] | 90 | 90 | — | 80 | 90 | 60 | 90 |

TABLE 1-continued

|  |  | Examples | | Comparative Examples | | | | Reference Example |
|---|---|---|---|---|---|---|---|---|
|  |  | 1 | 2 | 1 | 2 | 3 | 4 | 1 |
| Aging test (2) | Bonding strength [N] | 9.4 | 9.8 | — | 9.0 | 9.9 | 10.2 | 8.8 |
|  | Solder fracture rate [%] | 70 | 50 | — | 20 | 40 | 40 | 50 |

Figure 5:
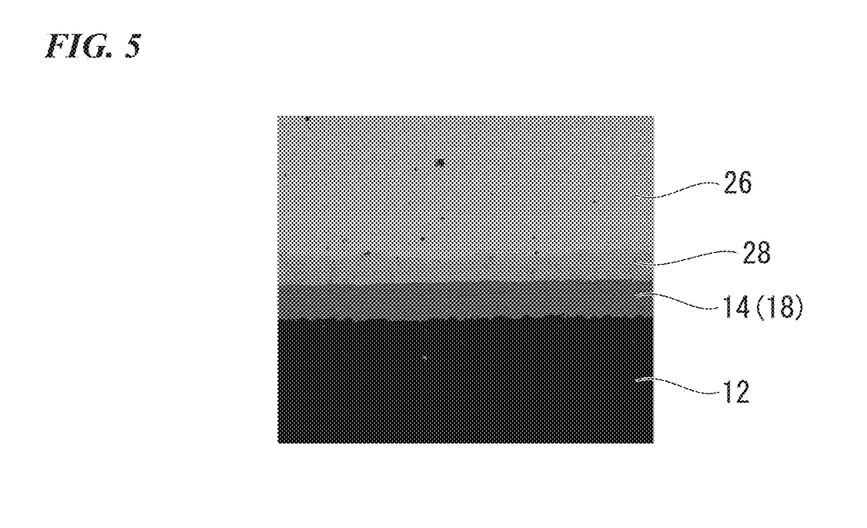
FIG. 5 is a reflected electron image obtained by observing a bonding interface between a plated film and solder after solder-mounting in Example 1.

As shown in Table 1, the wiring substrates in Examples 1 and 2 showed sufficient bonding strength and high solder fracture rate in all the reflow tests and the aging tests, and both reflow resistance and aging resistance were excellent. In addition, the wiring substrates in Examples 1 and 2 showed reflow resistance and aging resistance equivalent to or better than the reflow resistance and aging resistance of the wiring substrate in Reference Example 1, compared to the wiring substrate having an electroless nickel-plated layer including Pb in Reference Example 1. Further, as shown in FIG. 5, in Example 1, the intermetallic compound layer having a uniform thickness was formed on the wiring substrate after the solder-mounting.

On the other hand, in Comparative Example 2 in which the electroless nickel-plated layer does not contain Bi, the solder fracture rate was 30% in one time of reflow (reflow test (1)). Also, solder fracture rate was low in the aging test (2). Therefore, compared to the wiring substrate in Reference Example 1, both reflow resistance and aging resistance were deteriorated in Comparative Example 2. In Comparative Examples 3 and 4 in which the mass ratio of S and Bi (S/Bi) included in the electroless nickel-plated layer is 1.0 or less, the solder fracture rate was low and sufficient aging resistance was not obtained in the reflow test (2).

Figure 6:
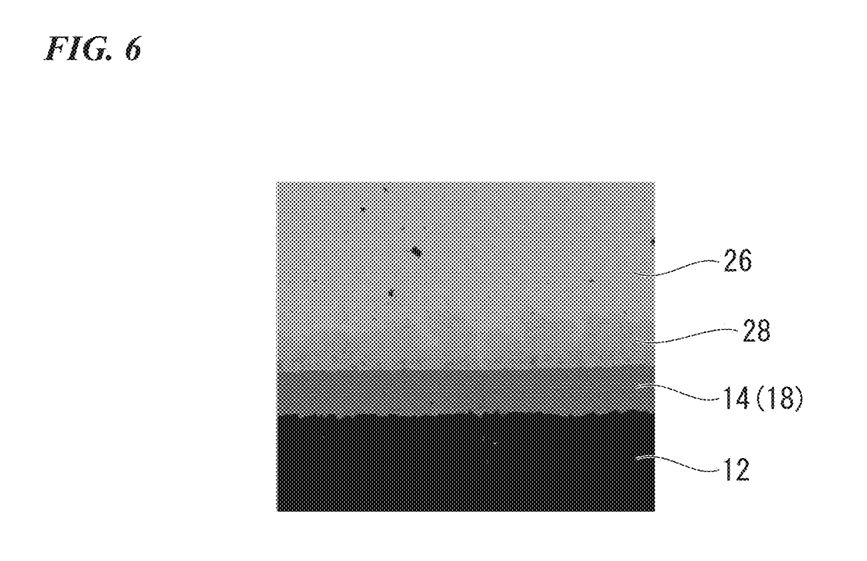
FIG. 6 is a reflected electron image obtained by observing a bonding interface between a plated film and a solder after solder-mounting in Comparative Example 2.
Figure 7:
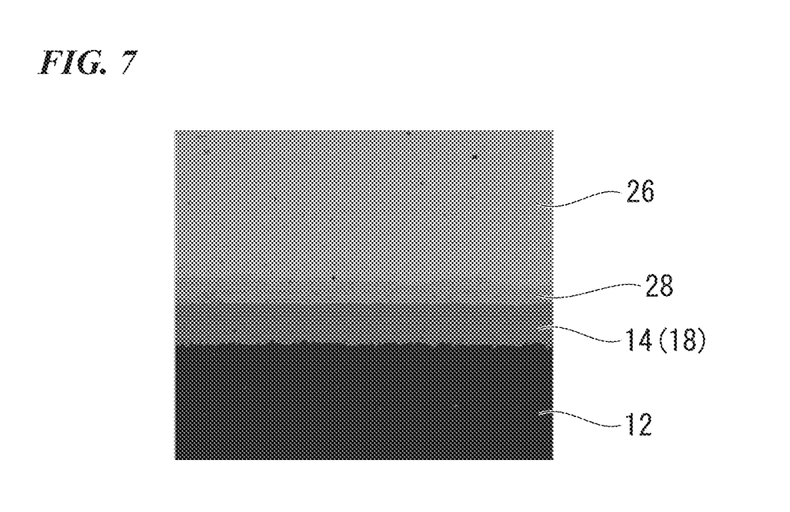
FIG. 7 is a reflected electron image obtained by observing a bonding interface between a plated film and a solder after solder-mounting in Comparative Example 3.
Figure 8:
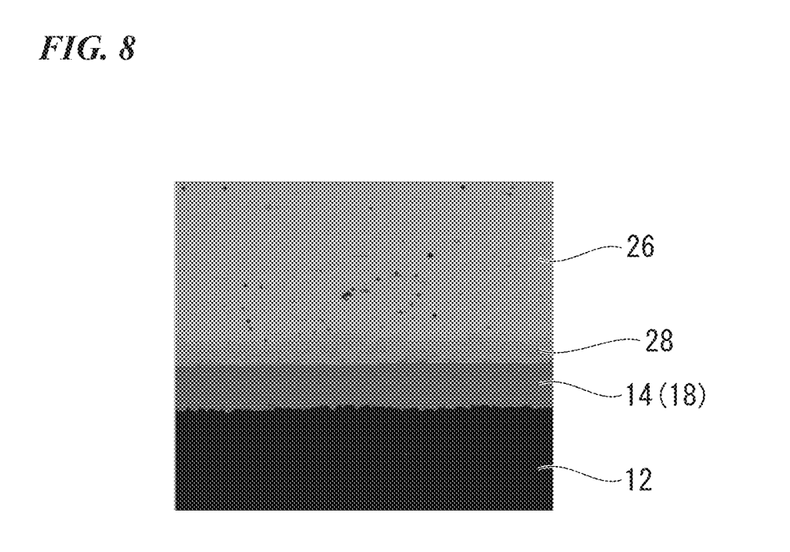
FIG. 8 is a reflected electron image obtained by observing a bonding interface between a plated film and a solder after solder-mounting in Comparative Example 4.

As shown in FIGS. 6 to 8, in Comparative Examples 3 and 4, the intermetallic compound layer having a certain degree of uniform thickness was formed. However, in Comparative Example 2, the segregation of the intermetallic compound was observed.

Examples 3 and 4

A plated film having a two-layer structure in which an electroless nickel-plated layer and an electroless gold-plated layer are laminated was formed on the pad in the same manner as in Examples 1 and 2 (without performing electroless palladium plating) except that the electroless palladium plating was performed.

Comparative Example 5

A plated film having a two-layer structure in which an electroless nickel-plated layer and an electroless gold-plated layer are laminated was formed on the pad in the same manner as in Comparative Example 2 (without performing electroless palladium plating) except that electroless palladium plating was performed.

Reference Example 2

A plated film having a two-layer structure in which an electroless nickel-plated layer and an electroless gold-plated layer are laminated was formed on the pad in the same manner as in Reference Example 1 (without performing electroless palladium plating) except that electroless palladium plating was performed.

[Analysis of Intermetallic Compound Layer]

In each of Examples 3 and 4, Comparative Example 5, and Reference Example 2, a solder ball composed of Sn-3Ag-0.5Cu and having a diameter of 350 μm was arranged on the plated film of the wiring substrate and five times of reflow was performed at a peak temperature of 240° C. Then, each sample was cross-sectioned and the element ratio of the intermetallic compound layer formed at the bonding interface between the plated film and the solder was measured by an Electron Probe X-ray Micro Analyzer (EPMA).

The result is shown in Table 2.

TABLE 2

| | Content of co-precipitate in electroless Ni-plated layer [ppm by mass] | | | Element ratio in intermetallic compound layer [% by atom] | | |
|---|---|---|---|---|---|---|
| | S | Bi | Pb | Sn | Ni | Cu |
| Example 3 | 1000 | 340 | — | 50.76 | 11.78 | 37.45 |
| Example 4 | 268 | 132 | — | 52.04 | 14.68 | 33.28 |
| Comparative Example 5 | 201 | — | — | 38.16 | 38.62 | 23.22 |
| Reference Example 2 | 142 | — | 270 | 38.03 | 34.57 | 27.40 |

As shown in Table 2, in the wiring substrates of Examples 3 and 4, the ratio of Ni was low in the intermetallic compound layer compared to the wiring substrate having the electroless nickel-plated layer not containing Bi in Comparative Example 2 and the wiring substrate having the electroless nickel-plated layer not containing Bi and containing Pb in Reference Example 2. In the wiring substrates in Examples 3 and 4, compared to the wiring substrate in Comparative Example 2 and the wiring substrate in Reference Example 2, the formation of a phosphorus-rich layer at the position close to the bonding interface between the plated film and the solder was suppressed, and thus, mounting reliability was high.

What is claimed is:

1. A wiring substrate, comprising:
   an electrode comprising Cu or a Cu alloy; and
   a plated film comprising an electroless nickel-plated layer formed on the electrode and an electroless gold-plated layer formed on the electroless nickel-plated layer,
   wherein the electroless nickel-plated layer is formed by co-precipitation of Ni, P, Bi, and S, the electroless nickel-plated layer comprises a content of P of 5% by mass or more and less than 10% by mass, a content of Bi of 1 ppm by mass to 1,000 ppm by mass, and a content of S of 1 ppm by mass to 2,000 ppm by mass, and a mass ratio of the content of S to the content of Bi (S/Bi) is more than 1.0.

2. The wiring substrate according to claim 1, wherein a total of the content of Bi and the content of S in the electroless nickel-plated layer is 400 ppm by mass or more.

3. The wiring substrate according to claim 1,
wherein an electroless palladium-plated layer is formed between the electroless nickel-plated layer and the electroless gold-plated layer.

4. The wiring substrate according to claim 3,
wherein a thickness of the electroless nickel-plated layer is 0.5 μm or more, a thickness of the electroless palladium-plated layer is 0.05 μm to 0.2 μm, and a thickness of the electroless gold-plated layer is 0.01 μm to 0.5 μm.

5. The wiring substrate according to claim 1, further comprising:
   a solder which comprises Cu, is free of Pb, and is bonded onto the plated film by heating; and
   an intermetallic compound layer formed at a bonding interface between the plated film and the solder,
   wherein an element ratio of Ni included in the intermetallic compound layer is 30% by atom or less.

6. A method of manufacturing the wiring substrate according to claim 1, comprising:
   forming the electroless nickel-plated layer on the electrode by electroless nickel plating treatment using an electroless nickel plating bath including nickel salt, a reducing agent comprising P, bismuth salt, and a sulfur-based compound.

* * * * *